United States Patent
Tracy

(10) Patent No.: US 6,720,961 B2
(45) Date of Patent: Apr. 13, 2004

(54) METHOD AND APPARATUS FOR DISPLAYING AN IMAGE IN THREE DIMENSIONS

(76) Inventor: Thomas M. Tracy, 68 Mendon St., Uxbridge, MA (US) 01569

( * ) Notice: Subject to any disclaimer, the term of this patent is extended or adjusted under 35 U.S.C. 154(b) by 293 days.

(21) Appl. No.: 10/008,345

(22) Filed: Nov. 6, 2001

(65) Prior Publication Data

US 2002/0105516 A1 Aug. 8, 2002

Related U.S. Application Data

(60) Provisional application No. 60/245,941, filed on Nov. 6, 2000.

(51) Int. Cl.$^7$ ................................................. G06T 15/00
(52) U.S. Cl. ....................................................... 345/419
(58) Field of Search ................................ 345/419, 420, 345/629, 630; 428/690, 917, 691, 692

(56) References Cited

U.S. PATENT DOCUMENTS

| | | | |
|---|---|---|---|
| 5,079,699 A | 1/1992 | Tuy et al. ............... 364/413.22 |
| 5,086,354 A | 2/1992 | Bass et al. ................... 359/465 |
| 5,331,553 A | 7/1994 | Muehllehner et al. . 364/413.24 |
| 5,502,798 A | 3/1996 | Ito et al. ...................... 395/119 |
| 5,589,980 A | 12/1996 | Bass et al. ................... 359/478 |
| 5,663,831 A | 9/1997 | Mashitani et al. .......... 359/463 |
| 5,790,086 A | 8/1998 | Zelitt .......................... 345/32 |
| 5,982,417 A | 11/1999 | Blonde ........................ 348/58 |
| 5,986,401 A | 11/1999 | Thompson et al. ......... 313/504 |
| 5,990,900 A | 11/1999 | Seago ......................... 345/427 |
| 6,054,969 A | 4/2000 | Haisma ........................ 345/7 |
| 6,059,727 A | 5/2000 | Fowlkes et al. ............ 600/443 |
| 6,281,902 B1 | 8/2001 | Nagashima ................. 345/419 |
| 6,407,408 B1 * | 6/2002 | Zhou et al. ................... 257/40 |

* cited by examiner

Primary Examiner—Phu K. Nguyen
(74) Attorney, Agent, or Firm—Raymond A. Nuzzo

(57) ABSTRACT

A method and apparatus for displaying a three-dimensional image of an object. In one embodiment, the method comprises the steps of providing a plurality of data sets, referred to as data slices, each said data slice representing a corresponding two-dimensional view of the object, providing a display system comprising a plurality of TOLED displays arranged one behind the other wherein one of the TOLED displays defines a front TOLED display and another one of the TOLED displays defines a rear TOLED display and wherein the plurality of TOLED displays defining three dimensions, and displaying a particular one of said data slices on a corresponding TOLED display so that when the plurality of TOLED displays are viewed through either the front or rear TOLED display, a three-dimensional image of the object appears.

20 Claims, 4 Drawing Sheets

METHOD AND APPARATUS FOR DISPLAYING AN IMAGE IN THREE DIMENSIONS

This patent application claims priority to commonly owned U.S. provisional patent application No. 60/245,941, filed Nov. 6, 2000.

BACKGROUND OF THE INVENTION

1. Field of the Invention

The present invention relates to a method and apparatus for displaying an image in three dimensions.

2. Prior Art

There are many instances where it is desirable or even necessary to view a two-dimensional image in a three-dimensional format. Such two dimensional images can be illustrations, drawings, photographs, motion pictures, etc.

It is known to simulate a three-dimensional image using dual two-dimensional media. Specifically, two images of the same scene are prepared, each being a two-dimensional view of the three-dimensional scene, but the two being taken from laterally spaced positions. When viewing one image with one eye and the other image with the other eye, the viewer perceives the image to have depth, in the same manner that the user's eyes perceive depth in actual three-dimensional scenes.

There are many types of conventional systems that effect simulation of a three-dimensional image using dual two-dimensional media. Such conventional systems typically use LCD (liquid crystal) displays. However, these displays are not well suited for viewing under bright ambient light. For example, light emitted from a bright light source, such as the sun, is reflected from one or more layers (primarily the metallic layers) of the LCD display. The reflected light interferes with the ability of a viewer to view information bearing light generated by the LCD display thereby reducing the perceived contrast of the image generated by the LCD display.

What is needed is a new and improved system for enabling a two-dimensional image to be viewed as a three-dimensional image. Specifically, the aforementioned system must provide for relatively improved contrast enabling the simulated three-dimensional image to be viewed under bright ambient light conditions. Furthermore, it is important that such a system provide relatively higher resolution, a relatively wider viewing angle, and the capability to view the simulated three-dimensional image from front and rear positions. It is also important that such a system can be more energy efficient and implemented at relatively low cost.

The present invention provides such an apparatus and method. Other benefits and advantages of the present invention will be apparent to one of ordinary skill in the art in light of the ensuing description of the present invention.

SUMMARY OF THE INVENTION

The present invention is directed to an optical viewing system that produces a simulated, three-dimensional image from at least two or more two-dimensional images that are projected at different apparent distances from the observer, and viewed through one another. In accordance with one embodiment of the present invention, each two-dimensional image is presented on a TOLED (Transparent Organic Light-Emitting Device) display.

Thus, in one aspect, the present invention is directed to a method for displaying a three-dimensional image of an object. The method comprises the steps of providing a plurality of data sets, referred to as data slices, wherein each data slice represents a corresponding two-dimensional view of the object, providing a display system comprising a plurality of TOLED displays consecutively arranged wherein one of the TOLED displays defines a front TOLED display and another one of the TOLED displays defines a rear TOLED display and wherein the plurality of TOLED displays define three dimensions, and displaying a particular one of the data slices on a corresponding TOLED display so that when the plurality of TOLED displays are viewed through either the front or rear TOLED display, a three-dimensional image of the object appears.

In a related aspect, the present invention is directed to a method for displaying a three-dimensional image of a flat image, comprising the steps of providing a flat image, generating an electronic version of the flat image, processing the electronic version of the flat image to generate a plurality of data sets, referred to as data slices, each data slice representing a corresponding two-dimensional view of the flat image, providing a display system comprising a plurality of consecutively positioned TOLED displays wherein one of the TOLED displays defines a front TOLED display and another one of the TOLED displays defines a rear TOLED display, the plurality of TOLED displays defining three dimensions, and displaying a particular one of the data slices on a corresponding TOLED display so that when the plurality of TOLED displays are viewed through either the front TOLED display or rear TOLED display, a three-dimensional image of the flat image appears.

In a further aspect, the present invention is directed to an apparatus for displaying a three-dimensional image of an object, comprising a processor for generating a plurality of data sets, referred to as data slices, each data slice representing a corresponding two-dimensional view of the object, a plurality of TOLED displays arranged consecutively one behind the other and wherein one of the TOLED displays defines a front TOLED display and another TOLED display defines a rear TOLED display, the plurality of TOLED displays defining three-dimensions, and a driver device for displaying a particular one of the data slices on a corresponding TOLED display so that when the plurality of TOLED displays are viewed through either the front TOLED display or the rear TOLED display, a three-dimensional image of the object appears.

BRIEF DESCRIPTION OF THE DRAWINGS

The figures are for illustration purposes only and are not drawn to scale. The invention itself, however, both as to organization and method of operation, may best be understood by reference to the detailed description which follows taken in conjunction with the accompanying drawings in which.

DETAILED DESCRIPTION OF THE PREFERRED EMBODIMENT

In describing the preferred embodiments of the present invention, reference will be made herein to FIGS. 1–6 in which like numerals refer to like features of the invention.

Figure 4:
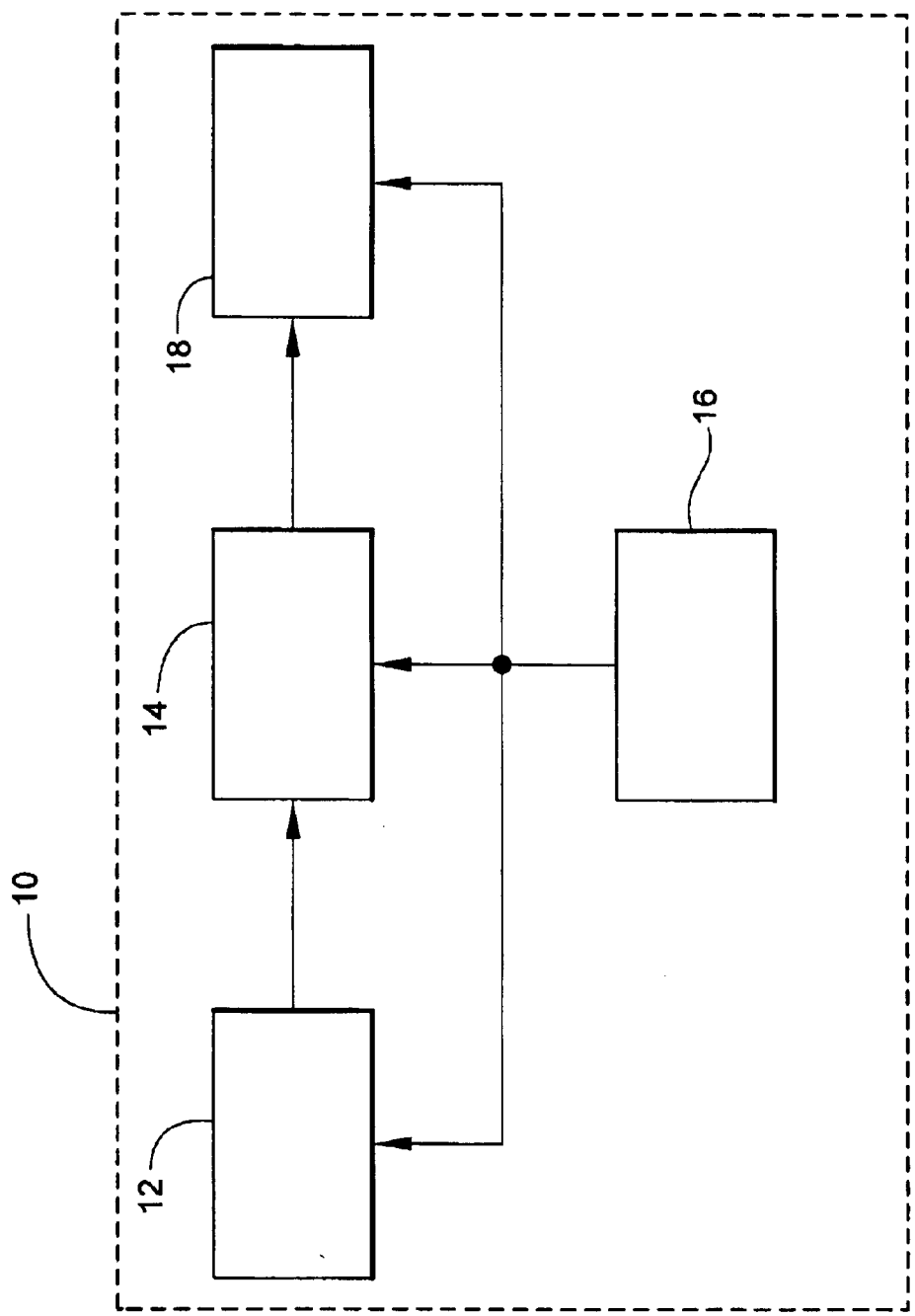
FIG. 4 is a block diagram of the apparatus of the present invention.

Referring to FIG. 4, in one embodiment, apparatus 10 of the present invention comprises image recording device 12, an image processor 14, a personal computer 16, and a TOLED display processor 18.

In one embodiment, image recording device 12 and image processor 14 are configured as a 3-D Camera. One such camera is known as a 3-D Axi-Vision camera that has been developed by Masahiro Kawakita of the Science & Technical Research Laboratories (STRL) division of the NHK (Japan Broadcasting Corporation). In another embodiment, image recording device 12 comprises a scanner.

In a preferred embodiment, personal computer 16 includes sufficient memory (RAM or ROM) for storing data outputted by image recording device 12 and processors 14 and 18.

In one embodiment, image processor 14 is configured to include a microprocessor, a data input device and a user interface. In such an embodiment, personal computer 16 would not be necessary.

TOLED display processor 18 comprises a plurality of TOLED displays which are described in detail in the ensuing description. TOLED display processor 18 further comprises a display driver (not shown) but which is known in the art. Examples of such display drivers are the commercially available models 12bx-p or 15bx-p monitors manufactured by Deep Video Imaging, Ltd of New Zealand.

The image recording device 12, image processor 14 and TOLED display processor 18 are all in electronic data communication with the personal computer 16. Personal computer 16 controls image recording device 12, image processor 14, and TOLED display processor 18.

Figure 1:
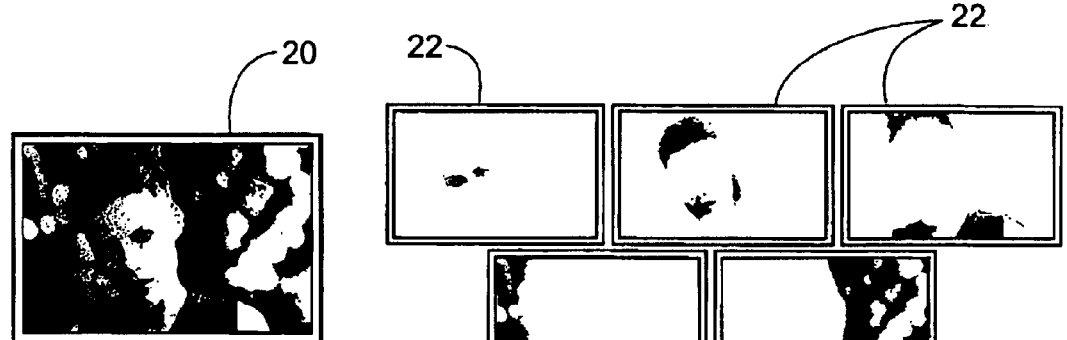
FIG. 1 is an illustration of a two-dimensional image.

Referring to FIG. 1, there is shown a two-dimensional image 20 of an object, (i.e. person). Image 20 can be a photograph, illustration, painting, etc. The apparatus 10 and method of the present invention simulates a three-dimensional image based on two-dimensional image 20. Image 20 may initially be in hardcopy form, such as an actual photograph (i.e. a flat image), or may be in a digitized image stored on a computer readable media such as diskette, CD-ROM, etc.

In the first step of the method of the present invention, image recording device 12 is to generate an electronic version of image 20. This can be accomplished by any of the commercially available electronic image scanning or recording devices, some of which are described in U.S. Pat. Nos. 5,990,900 and 6,059,727, the disclosures of which are herein incorporated by reference. Other suitable examples of suitable image recording devices are MRI (magnetic resonance imaging) devices or scanners, or CAT (computerized axial topography) imaging devices or scanners. Another example of a suitable image recording device is a system that utilizes scanning capability and three-dimensional computer graphics. As a result of this step, the image 20 is digitized.

Figure 2:
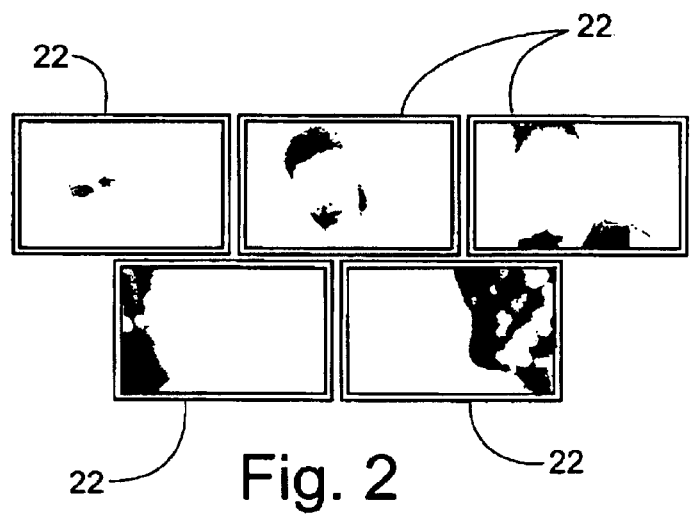
FIG. 2 illustrates the separation of the image of FIG. 1 into a plurality of two-dimensional image layers.

Referring to FIG. 2, the digitized image is then inputted into image processor 14 which is programmed with particular software that effects uniform separation of the digitized two-dimensional image into a plurality of data sets, referred to as two-dimensional "data slices" wherein each data slice represents a corresponding two-dimensional image layer that is a portion of the complete digitized image 20. Such a technique is described in the aforementioned U.S. Pat. No. 6,059,727 which has been incorporated herein by reference. As used herein, the terms "data slices" and "two-dimensional image layers" and "image layers" have the same meaning and are used interchangeably.

There can be many criteria used in the separation process. For example, separation of the digitized image into data slices or image layers 22 can be based on color, tint, motion, focal length, etc.

In accordance with the present invention, each data slice or image layer 22 is assigned a z-coordinate that facilitates identification of each data slice 22. The resulting resolution of the simulated three-dimensional image depends upon the resulting number of data slices 22 into which the digitized image is separated.

Figure 3:
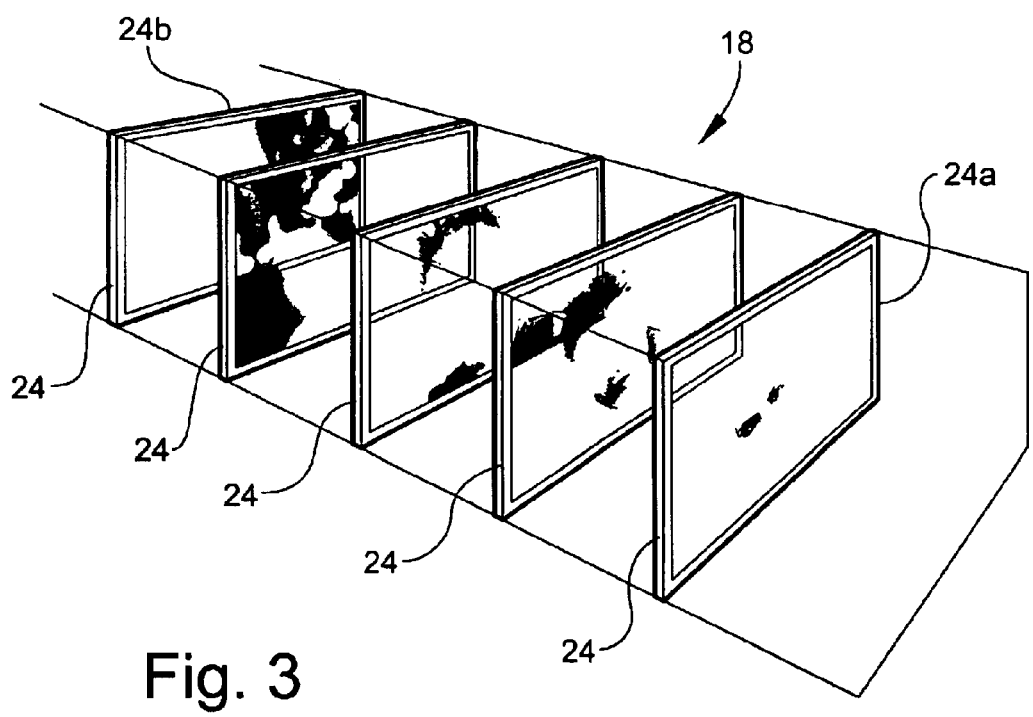
FIG. 3 illustrates the positioning of a plurality of TOLED displays wherein each TOLED display presents one of the two-dimensional image layers shown in FIG. 2.

Referring to FIGS. 3 and 4, separated image layers 22 are inputted into TOLED display processor 18. Processor 18 comprises a driver system (not shown) that receives the electronic data from image processor 14 wherein such electronic data represents the separated image layers (or data slices) 22.

Referring to FIGS. 3 and 4, processor 18 further includes a plurality of TOLED displays 24 that are sequentially or consecutively positioned (i.e. one behind the other) at predetermined locations along the Z-axis. TOLED displays are described in U.S. Pat. No. 5,986,401, the disclosure of which is incorporated herein by reference. The TOLED displays may be configured as any suitable commercially available TOLED displays. Such suitable commercially available TOLED displays are available from Universal Display Corporation of Ewing, N.J. TOLED displays 24 significantly improve contrast, making it much easier to view displays in bright sunlight.

Figure 5:
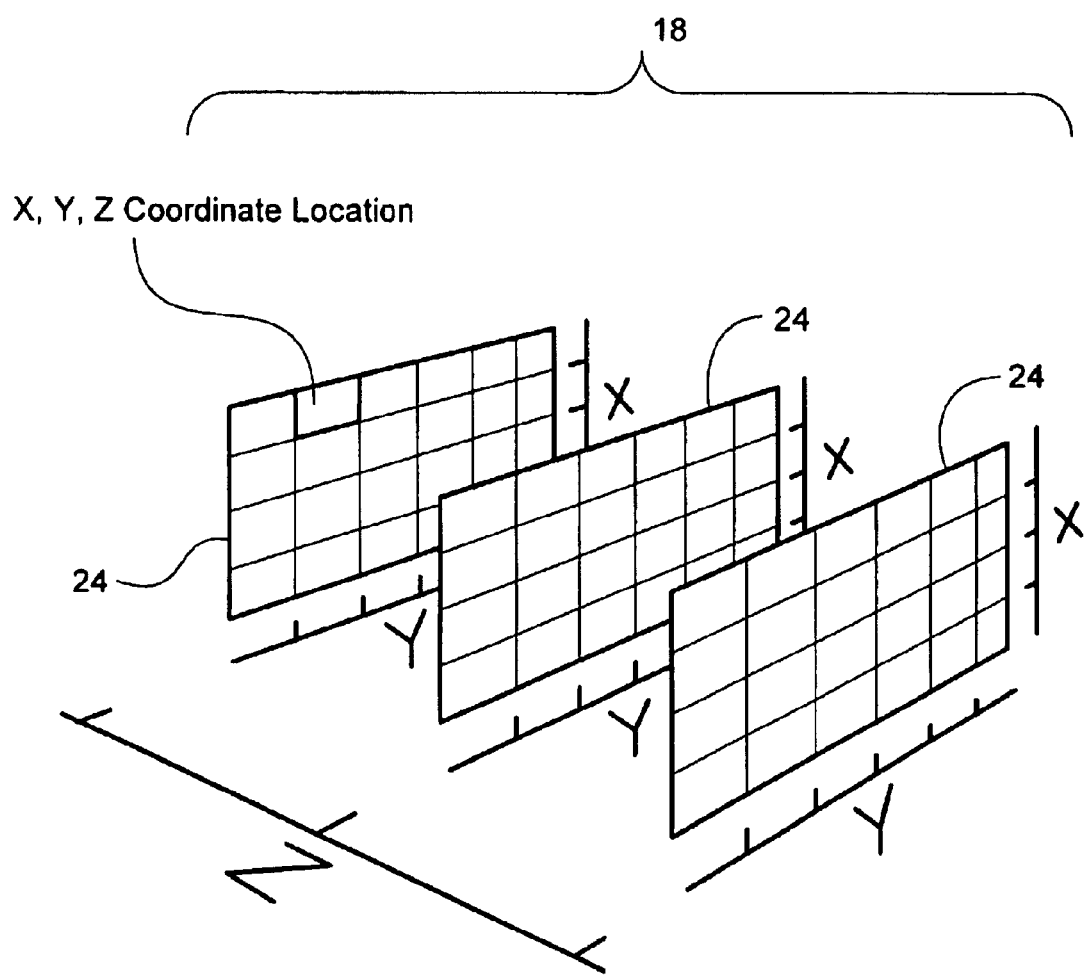
FIG. 5 is a diagram that illustrates the three-dimensional aspect of the TOLED displays of FIG. 3.

Thus, each TOLED display 24 is located at a particular z-coordinate (see FIG. 5). The electronic data associated with each data slice or image layer 22 is assigned to a corresponding TOLED display 24. In one embodiment, data slices or image layers 22 are assigned to a corresponding TOLED display 24 in a sequential or consecutive manner. In another embodiment, apparatus 10 enables the electronic data associated with a particular data slice or image layer 22 to be assigned to any one of the TOLED displays 24.

Referred to FIG. 3, TOLED display processor 18 is configured to allow a viewer to view the simulated 3-D image by looking through the front TOLED display, indicated by numeral 24a, and by looking through the rear display, indicated by numeral 24b.

In one embodiment, in the case of flat images, such as photographs, drawings, illustrations, etc., a scanner can be used to generate an electronic version of the flat image. The electronic version can be inputted into a computer that is programmed with suitable commercially available graphics programs, such as Photoshop™ marketed by Adobe, which can be used to separate the electronic version of the flat image into two dimensional data slices wherein each data slice corresponds to a corresponding two-dimensional image layer that is a portion of the complete flat image.

In another embodiment of the invention, when an image is first captured by a 3-D imaging device, such as a CAT scan, MRI, 3-D camera, or if the image is created using 3D computer graphics, image processor 14 is configured to enable a user to select a desired viewpoint of the image captured by the 3-D imaging device. The portion of the captured image that encompasses the desired viewpoint is then processed so as to generate the plurality of data slices as described in the foregoing description. In such an embodiment, the image processor 14 is configured to enable the user to select the desired view point. Each of the generated data slices are then displayed on a corresponding TOLED display 24.

Figure 6:
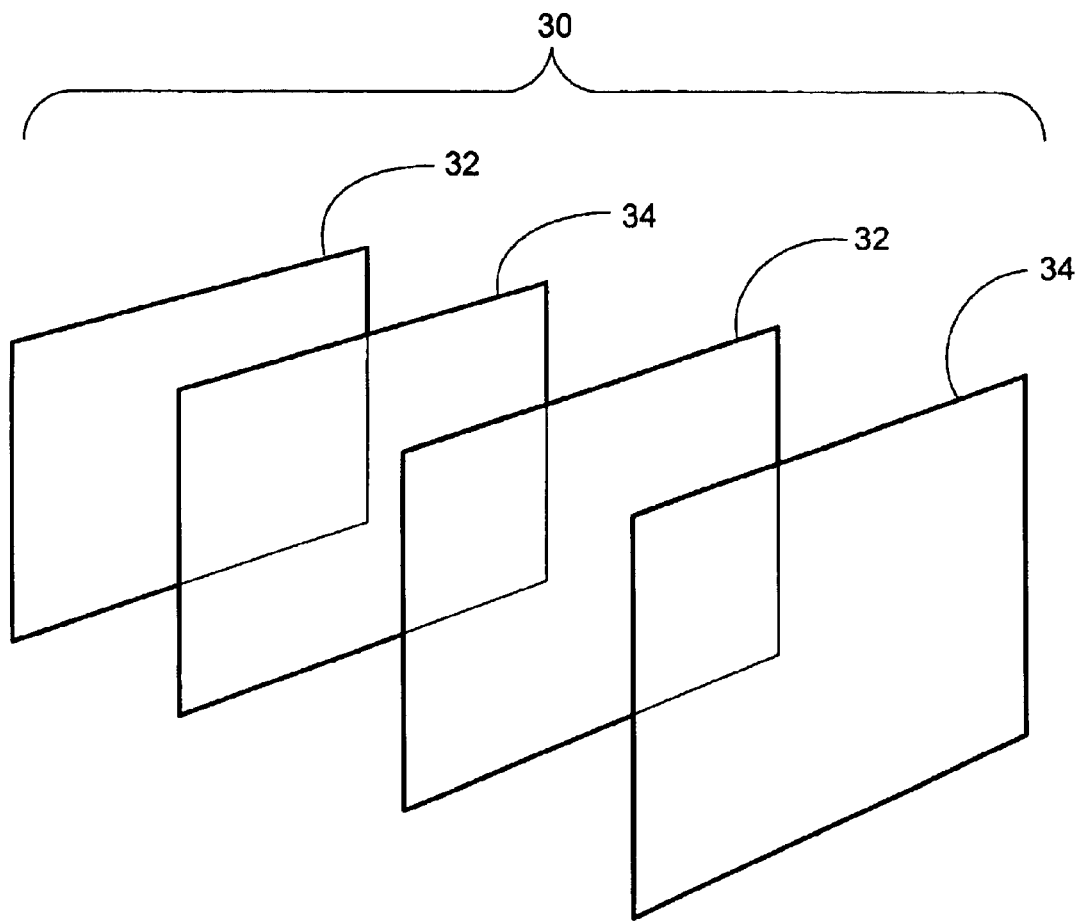
FIG. 6 is a diagram of an alternate embodiment of the TOLED display processor depicted in FIG. 4.

In an alternate embodiment, each TOLED display is configured as a MF-SOLED (metal-free organic light emitting device) display. However, it is to be understood that other types of transparent TOLED displays can be used, such as SOLED (Stacked OLED), FOLED (Flexible OLED) or PHOLED (Phosphorous OLED). In a further embodiment, each TOLED display is configured as a MF-SOLED display and an LCD (liquid crystal display) is positioned between each pair of consecutively positioned MF-SOLED displays. Such an embodiment is shown in FIG. 6 wherein alternate TOLED processor 30 comprises a plurality of MF-SOLED displays 32 and a plurality of LCDs 34 (FIG. 6 is only a partial view of alternate embodiment of TOLED processor 18). Each LCD 32 is positioned between a pair of adjacent MF-SOLED displays. Alternating the LCDs and MF-SOLED displays in the manner shown in FIG. 6 increases the range of unique visual effects. Each MF-SOLED display is configured for transparent to opaque emission of light in color. Each LCD is configured for transparent to opaque subtraction of light in black and color.

In a further embodiment, TOLED display processor 18 is configured to utilize a SOLED (stacked organic light emitting display) rather than the individual TOLED displays 24 spaced apart. A SOLED display comprises an array of stacked TOLED display sub-pixels. To separately tune color and brightness, each of the red, green and blue (R-G-B) sub-pixel elements is individually controlled. By adjusting the ratio of current through the stack, brightness is varied. By modulating the pulse width, gray scale is achieved. Commercially available SOLED displays are available from Universal Display Corporation.

In another embodiment of the invention, an indicator device (not shown) is used to indicate or point to any pixel location on any of the TOLED displays 24. Such an indicator device is configured to point or refer to any pixel location in any dimension defined by the "x,y,z" coordinates shown in FIG. 5. In one embodiment, the indicator device is in electronic data communication with personal computer 16. In another embodiment, the indicator device is in electronic data communication with the TOLED processor 18. In one embodiment, the indicator device is a mouse that comprises the standard components for indicating points defined by an "x,y" coordinate (two-dimensional) system and additional components to enable pointing to points defined by a "z" coordinate as well. In such an embodiment, the mouse includes a wheel, toggle or slide switch to define the "z" coordinate.

Thus, the method and apparatus of the present invention provide many advantages. Specifically, the present invention:

a) provides a relatively greater viewing angle;
b) effects the generation of light on each image layer shown on each TOLED display 24 thereby providing a relatively brighter, higher contrast;
c) enables the 3-D image provided by TOLED displays 24 to be viewed from the front or back;
d) provides for a relatively faster presentation of the 3-D image due to the relatively faster response time of the TOLED displays 24;
e) can be implemented with a variety of commercially available hardware and software systems and components;
f) is relatively more energy efficient; and
g) can be implemented at a relatively low cost.

The principals, preferred embodiments and modes of operation of the present invention have been described in the foregoing specification. The invention which is intended to be protected herein should not, however, be construed as limited to the particular forms disclosed, as these are to be regarded as illustrative rather than restrictive. Variations in changes may be made by those skilled in the art without departing from the spirit of the invention. Accordingly, the foregoing detailed description should be considered exemplary in nature and not limited to the scope and spirit of the invention as set forth in the attached claims.

What is claimed is:

1. A method for displaying a three-dimensional image of an object, comprising the steps of:

providing a plurality of data sets, referred to as data slices, each said data slice representing a respective two-dimensional view of the object;

providing a display system comprising a plurality of TOLED displays arranged one behind the other wherein one of the TOLED displays defines a front TOLED display and another one of the TOLED display defines a rear TOLED display, the plurality of TOLED displays defining three dimensions; and displaying a particular one of said data slices on a corresponding TOLED display so that when the plurality of TOLED display are viewed through either the front or rear TOLED display, a three-dimensional image of the object appears.

2. The method according to claim 1 wherein providing the plurality of data sets includes:

generating electronically an image of the object; and
generating the plurality of data sets, referred to as the data slices, wherein each data slice represents said corresponding two-dimensional image of the generated image.

3. The method according to claim 1 wherein the plurality of TOLED displays comprises a SOLED display.

4. The method according to claim 1 wherein the TOLED displays are spaced apart from one another by a predetermined distance.

5. The method according to claim 1 further comprising an LCD positioned between a pair of consecutively positioned TOLED displays.

6. The method according to claim 1 wherein the three dimensions defined by of the plurality TOLED displays are defined by x, y and z coordinates and wherein providing the display system includes:

assigning a particular z coordinate to each TOLED display; and
positioning each TOLED display according to the z-coordinate assigned thereto.

7. The method according to claim 1 wherein each TOLED is a metal-free organic light emitting display.

8. A method for displaying a three-dimensional image of a flat image, comprising the steps of:

providing a flat image;
generating an electronic version of the flat image;
processing the electronic version of the flat image to generate a plurality of data sets, referred to as data slices, each data slice representing a corresponding two-dimensional view of the flat image;
providing a display system comprising a plurality of consecutively positioned TOLED display wherein one of the TOLED displays defines a front TOLED display and another one of the TOLED displays defines a rear TOLED display, the plurality of TOLED displays defining three dimensions; and displaying a particular one of said data slices on a corresponding TOLED display so that when the plurality of TOLED displays are viewed through either the front TOLED display or rear TOLED display, a three-dimensional image of the flat image appears.

9. The method according to claim 8 wherein generating an electronic version of the flat image comprises scanning the flat image.

10. The method according to claim 8 wherein the display system includes a plurality of LCDs, each LCD being positioned between a corresponding pair of consecutively positioned TOLED displays.

11. The method according to claim 8 wherein the plurality of TOLED displays comprises a SOLED display.

12. An apparatus for displaying a three-dimensional image of an object, comprising:
- a processor for generating a plurality of data sets, referred to as data slices, each said data slice representing a corresponding two-dimensional view of the object;
- a plurality of TOLED displays arranged consecutively and wherein one of the TOLED displays defines a front TOLED display and another TOLED display defines a rear TOLED display, the plurality of TOLED displays defining three-dimensions; and
- a driver device for displaying a particular one of said data slices on a corresponding TOLED display so that when the plurality of TOLED displays are viewed through either the front TOLED display or the rear TOLED display, a three-dimensional image of the object appears.

13. The apparatus according to claim 12 further comprising means for generating an image of the object, and wherein the processor is configured to generate the plurality of data sets, referred to as the data slices, wherein each data slice represents said corresponding two-dimensional image of the electronically generated image.

14. The apparatus according to claim 12 further comprising an LCD display positioned between a pair of consecutively positioned TOLED display.

15. The apparatus according to claim 12 further comprising a plurality of LCDs, each LCD being positioned between a pair of consecutively positioned TOLED displays.

16. The apparatus according to claim 12 wherein the plurality of TOLED displays comprises a SOLED display.

17. The apparatus according to claim 12 wherein the three dimensions of the plurality of TOLED displays are defined by x, y and z coordinates and wherein each TOLED display is positioned at a corresponding z coordinate.

18. The apparatus according to claim 12 further comprising means for electronically generating an image of the object and wherein the processor is configured to generate the plurality of data sets, referred to as the data slices, wherein each data slice represents the corresponding two-dimensional image of the generated image.

19. The apparatus according to claim 12 wherein each of the TOLED displays comprises a metal-free organic light emitting display.

20. The apparatus according to claim 12 further comprising an indicating device in electronic data communication with the TOLED displays and driver device for indicating any portion of the three-dimensional image displayed on any of the TOLED displays.

* * * * *